ically used as a control amplifier in the receiver of a basic group, for example, a basic 60-group of the system wherein the amplification of the amplifier is then controlled by a pilot receiver common for all the 60-groups. The amplifier includes an amplifier stage having constant amplification and which receives the pilot signal. A negative feedback path is connected via a first impedance converter from the output to the input of the amplifier stage. This path includes a capacitive voltage divider together with a second impedance converter and an RC-link. The capacitor values in the voltage divider are varied in dependence on a regulating voltage from the pilot receiver of the system, whereby the degree of negative feedback and thus the amplification of the amplifier can be controlled.

United States Patent [19]
Duncker et al.

[11] 4,023,112
[45] May 10, 1977

[54] BROAD BAND AMPLIFIER HAVING NEGATIVE FEEDBACK AND A CONTROLLABLE AMPLIFICATION FACTOR

[75] Inventors: Bodo Kurt Adolf Duncker, Varmdo; Bo Sören Tage Eberstein, Hagersten, both of Sweden

[73] Assignee: Telefonaktiebolaget L M Ericsson, Stockholm, Sweden

[22] Filed: June 12, 1975

[21] Appl. No.: 586,199

[30] Foreign Application Priority Data

July 26, 1974 Sweden .................. 097031/74

[52] U.S. Cl. ............................. 330/29; 330/28; 330/85; 330/86; 330/109; 330/145

[51] Int. Cl.² ...................................... H03G 3/30

[58] Field of Search ............ 330/28, 29, 85, 86, 330/145, 109

[56] References Cited

UNITED STATES PATENTS

| | | | |
|---|---|---|---|
| 2,631,201 | 3/1953 | Morrison | 330/85 X |
| 2,999,169 | 9/1961 | Feiner | 330/29 X |

Primary Examiner—Rudolph V. Rolinec
Assistant Examiner—Lawrence J. Dahl
Attorney, Agent, or Firm—Hane, Sullivan & Spiecens

[57] ABSTRACT

A broad band amplifier with negative feedback and controllable amplification factor for use in a carrier frequency system is described. The amplifier is preferably used as a control amplifier in the receiver of a basic group, for example, a basic 60-group of the system wherein the amplification of the amplifier is then controlled by a pilot receiver common for all the 60-groups. The amplifier includes an amplifier stage having constant amplification and which receives the pilot signal. A negative feedback path is connected via a first impedance converter from the output to the input of the amplifier stage. This path includes a capacitive voltage divider together with a second impedance converter and an RC-link. The capacitor values in the voltage divider are varied in dependence on a regulating voltage from the pilot receiver of the system, whereby the degree of negative feedback and thus the amplification of the amplifier can be controlled.

9 Claims, 5 Drawing Figures

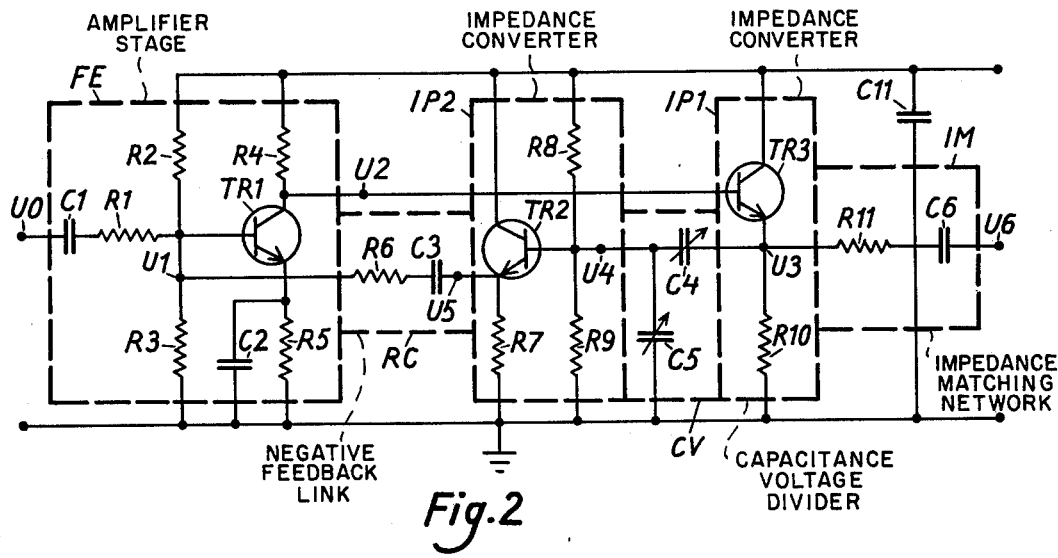
Fig. 2
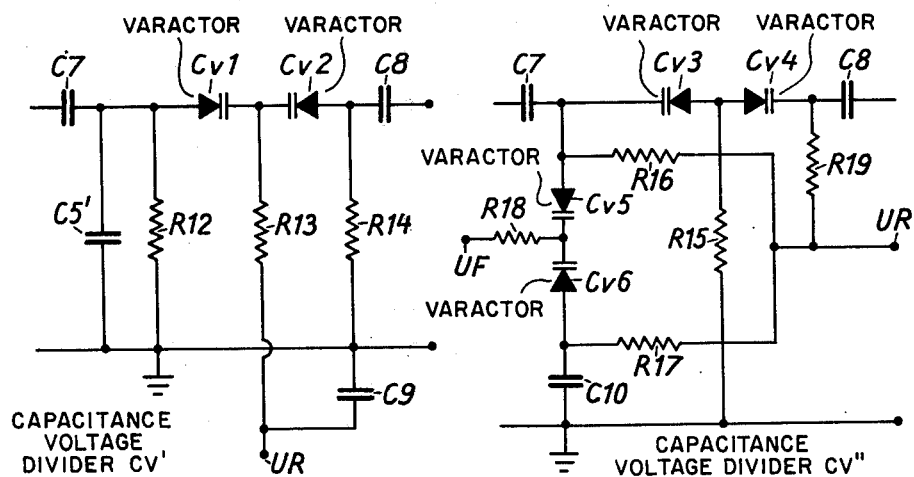
Fig. 3
Fig. 4

BROAD BAND AMPLIFIER HAVING NEGATIVE FEEDBACK AND A CONTROLLABLE AMPLIFICATION FACTOR

The present invention relates to a broad band amplifier having negative feedback and a controllable amplification factor, preferably for frequency independent level control by means of a pilot signal in a carrier frequency equipment.

In carrier frequency transmission, certain frequency bands are used for the transmission of the separate speech bands. Actual frequency ranges are then

| | | | |
|---|---|---|---|
| 60–108 | kHz for a basic | 12 - | group |
| 312–552 | " | 60 - | " |
| 812–2044 | " | 300 - | " |
| 8516–12388 | " | 900 - | " |

In each of these frequency ranges an international standardized pilot signal with a nominal level is transmitted i.e., the level of the pilot signal corresponds to the nominal level of the carrier frequency system. In a received frequency band the level of the received pilot signal constitutes a measure of the condition of the transmission system. A purpose of the signal is to indicate eventual divergence in this condition, for example, varying attenuation caused by temperature variations or any switching process in the transmission network. To accomplish this purpose there is provided a pilot receiver which selects the pilot signal, and amplifies and rectifies it. The received signal thus obtained is a control signal supplied to a control amplifier connected in the receiver path.

In a basic 60-group, for example, the incoming frequency divided speech bands are divided within the frequency range 60-4.028 kHz into 16 different space divided channels, all channels being included within the frequency range 312–552 kHz. Two different cases are then possible as regards the arrangement of the pilot receivers and the associated control amplifier. The first case consists in that, in each 60-group there is provided a pilot receiver together with the associated amplifier. Consequently, 16 different pilot receivers-control amplifiers are present. The second case relates to only one pilot receiver and associated control amplifiers for all the 60-groups. This means that in each 60-group a control amplifier is included, but each of the amplifiers is controlled from a common pilot receiver which is sequentially connected to the control amplifiers. It is in this case necessary that a memory function be provided in each amplifier so that, even if the control signal, i.e. the output signal from the pilot receiver disappears, the amplifier is capable of maintaining to the amplification which it had been set by means of the output signal from the pilot receiver during the last connection thereto.

The amplifier according to the present invention is primarily intended to be used as a control amplifier in a 12-group, a 60-group, a 300-group or a 900-group system. The amplifier has a built-in memory function so that it can be controlled by control signals from a pilot receiver common for all groups.

Several embodiments of such a control amplifiers are known in the prior art. In one embodiment, mechanically movable components are used to operate a potentiometer by means of which the amplification is varied. In another embodiment, a transfluxor is used as control element which, however, is comparatively complicated and demands considerable power for the control. It is also previously known to use a thermistor as the regulating means. This solution has the drawback that it is expensive and demands preparatory adjusting. In addition this component demands, like the transfluxor, a considerable power to change its component value.

An object of the present invention is to provide an amplifier of the above mentioned kind in which the amplification can be controlled automatically and be frequency independent over a great frequency range by means of frequency dependent elements and in which there is a memory function for the control signal supplied to the amplifier.

The invention, the characteristics of which appear from the appended claims, will be described more fully in connection with the accompanying drawings, in which:

FIG. 2 shows an example of one embodiment of the amplifier according to FIG. 1;

FIG. 3 shows an example of a capacitive voltage divider included in the amplifier according to FIG. 2;

FIG. 4 shows a further embodiment of the capacitive voltage divider included in the amplifier according to FIG. 2.

Figure 1:
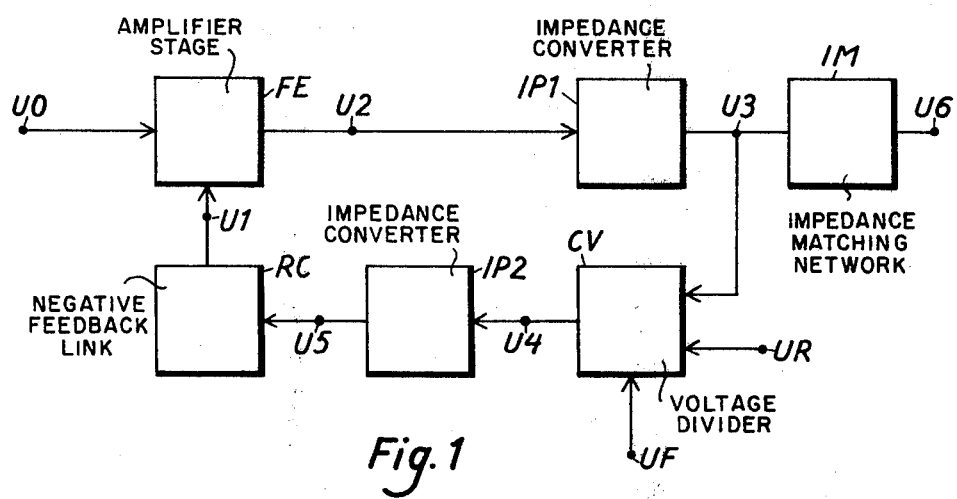
FIG. 1 shows a block diagram of the amplifier according to the invention.

FIG. 1 shows in a block diagram the principle of the amplifier according to the present invention. An amplifier stage of known design is designated FE, the input of which is connected to a basic 60-group as described above. The input signal U0 can thus constitute a pilot signal, the level of which is to be controlled. The amplifier stage FE is connected to a first impedance converter IP1 to obtain the amplified signal U2 across a low-ohmic output. Across the output of the impedance converter IP1 a signal U3 is obtained which corresponds to the amplified signal U2, but from a low impedance output (in the order of a few ohms). The amplifier stage FE receives negative feedback signals via the negative feedback loop which includes a capacitive voltage divider CV, a second impedance converter IP2 and a negative feedback link RC. All voltages U1-U6 in FIG. 1 are related to a reference potential (not shown), for example, ground. Across the output of the capacitive voltage divider CV a voltage U4 appears, the magnitude of which is a fraction of the voltage U3 across the output at the amplifier stage FE, the quotient U4/U3 being determined by the magnitude of the control voltage received at a control input of the divider. This voltage is obtained from the output of a pilot receiver which is not shown in FIG. 1, but which is included in the carrier frequency system. A constant voltage UF constitutes a supply voltage for the voltage divider CV. The impedance converter IP2 connected to the output of the voltage divider CV has a high input impedance and a low output impedance. Owing to the properties of the impedance converters, such as the low output impedance of the converter IP1 and the high input impedance of the converter IP2, the desired impedance matching of the capacitive voltage divider CV to the amplifier stage FE is obtained. The degree of negative feedback and the total amplification of the amplifier stage can thus be varied in dependence on the value of the control voltage UR. By means of the negative feedback link RC connected between the output of the second impedance converter IP2 and the input of the amplifier stage FE, further variation of the degree of negative feedback can be obtained. An impedance network IM known per se matches the output impedance of the amplifier to the subsequent circuits.

With reference to FIG. 2, an embodiment of the amplifier stage according to FIG. 1 will be described in more detail. The amplifier stage FE according to FIG. 1 consists of a bipolar transistor TR1 connected as a common emitter stage with associated voltage divider resistors R2, R3, a collector resistor R4 and an emitter resistor R5 for determining the operating point of the transistor. The capacitors C2 and C11 are decoupling capacitors. The input impedance of the negative feedback amplifier stage FE is determined by the resistance of the resistor R1 connected between coupling capacitor C1 and the base of the transistor. The capacitor C1 which constitutes a coupling capacitor receives the input signal 40. The common connection point between the resistor R4 and the collector of the transistor TR1 constitutes the output of the amplifier stage. The impedance converter IP1 includes a transistor TR3 and a resistor R10. The transistor TR3 is connected as a common collector stage, the input impedance of this stage being high and the output impedance from the common connection point between the emitter of the transistor TR3 and the resistor R10 being low, in the order of a few ohms. This point is connected to the capacitive voltage divider CV which in the present embodiment comprises two variable capacitors C4, C5. To the output of the capacitive voltage divider a second impedance converter IP2 is connected which comprises a transistor TR2 connected as a common collector stage and associated voltage divider resistors R8, R9. A resistor R7 is connected between the emitter and an earth potential common for the whole amplifier stage for determining the operating point of the transistor TR2. A negative feedback link RC comprising the resistor-capacitor combination R6, C3 is connected between the emitter of the transistor TR2 and the input of the amplifier stage FE (the base of transistor TR1). The output impedance of the impedance converter IP2 is low, while its input impedance is high. By varying the resistance of the resistor R6, the degree of negative feedback and thus the total amplification of the amplifier according to FIG. 1 can be changed.

From the above it is apparent that the capacitive voltage divider CV is fed from a low impedance source, i.e., the output of the impedance converter IP1 and tranmits a high impedance sink, i.e., the input of the impedance converter IP2. An incoming signal U0 to the amplifier is phase inverted and amplified in the amplifier stage FE which in response thereto transmits a voltage U2. This voltage is received at the input of the impedance converter IP1 where it is impedance transformed and fed as a low impedance signal U3 to the capacitive voltage divider CV. Across the output of this capacitive voltage divider a voltage U4 is obtained and, depending on the impedance conditions between input and output, the following relation is valid $$U4 = U3/(1+C5/C4),$$

where C4 and C5 are the capacitance values of the capacitors C4 and C5 included in the capacitive voltage divider. By varying the quotient C5/C4 the degree of negative feedback and, consequently, also the amplification of the amplifier can be varied.

The resistor R11 and the capacitor C6 of the impedance matching network IM determine the output impedance of the amplifier. The output voltage of the amplifier is designated U6 and its input voltage Uo. If the total amplification of the amplifier is designated Av, the following relation is valid $$Av = \frac{U6}{Uo} \approx \frac{1}{2} \frac{R6}{R1} \left(1 + \frac{C5}{C4}\right)$$

The amplification Av can thus be regulated by varying the quotient C5/C4, i.e., the control range of the amplifier is determined by this quotient.

FIG. 3 shows an embodiment of the capacitive voltage divider CU' when automatic control of the amplification of the amplifier is desired. Two capacitance diodes or varactors CV1, CV2 have their cathodes connected and are connected to a control voltage UR via the resistor R13. This voltage UR is, for example, obtained from the pilot receiver in a carrier frequency system as described above. Each of the anodes of the capacitance diodes CV1, CV2 are via the resistors R12 and R14, respectively connected to ground potential. The voltage UR has such polarity that the diodes are biased in its blocked condition, the capacitance value of the diodes being dependent on the voltage UR. In this manner two series connected voltage dependent capacitances are obtained which both correspond to the capacitance of the capacitor C4 of FIG. 2 discussed above. The capacitor C5' has a constant capacitance value and corresponds to the capacitor C5 of FIG. 2 according to the above. The capacitors C7 and C8 are coupling capacitors, the capacitor C8 being connected to the output of the impedance converter IP1 and the capacitor C7 being connected to the subsequent impedance converter IP2. The resistors R12, R13, R14 have high resistance value (in the order of MΩ) and serve as regards for DC to connect the capacitance diodes CV1, CV2 to the control voltage UR and to earth potential, If the sum of the capacitances of the diodes CV1 and CV2 is designated C4', in similar manner as in the case of variable capacitors according to the above, it is valid that U4 = U3/(1+C5'/C4'). Consequently, the degree of the negative feedback can be varied by the control voltage UR, as the quotient C5'/C4' is a function of the control voltage UR.

Figure 5:
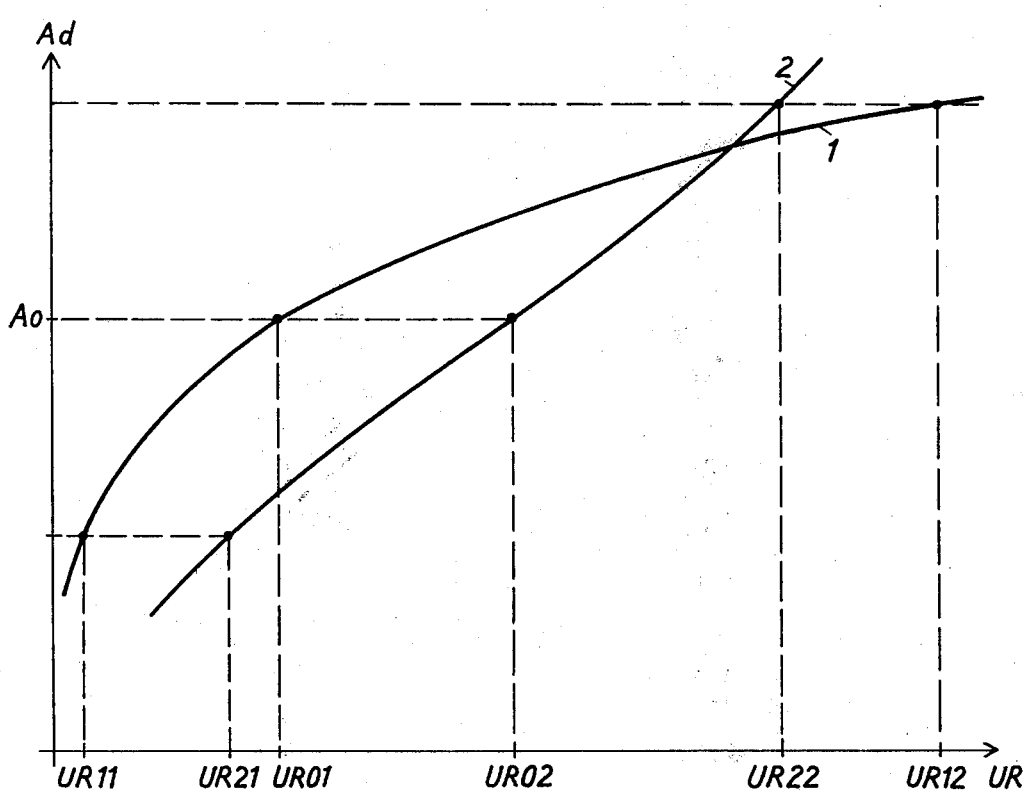
FIG. 5 is a diagram which shows the amplification as a function of a control voltage which is supplied to the amplifier according to the invention.

In FIG. 4, another embodiment of the capacitive voltage divider CV is shown where both the series and parallel link contain voltage dependent capacitors. The anodes of the diodes CV3, CV4 are connected together and via the resistor R15 connected to ground potential. The anodes of the diodes CV5, CV6 are each connected to the control voltage UR via the resistors R16, R17, respectively. The cathodes of these diodes are connected together and, via the resistor R18, connected to a constant voltage UF in the order of 10 V. The cathode of the diode CV3 is, via the resistor R16 connected to the control voltage UR and the anode of the diode CV4 is, via the resistor R19, connected to the control voltage UR. Usually the value of control voltage UR is a few volts. For example, when UR = 1 V, the voltage across diodes CV3 and CV4 is about 1 volt each and the voltage across diodes CV5, CV6 is about 9 volt. With the circuit according to FIG. 4 a steeper control characteristic is obtained as is apparent from the diagram according to FIG. 5. In this diagram the amplification Ad as a function of the control voltage UR is shown. For the circuit according to FIG. 3, a characteristic according to curve 1 is obtained, while with the circuit according to FIG. 4 a characteristic according to curve 2 is obtained. From the diagram it is seen that for different values UR01 and UR02, a certain nominal amplification Ao is obtained dependent on which of the circuits according to FIG. 3 or FIG. 4 is used as a voltage dependent capacitance. The circuit according to FIG. 4 gives a nearly linear characteristic between the two values UR21 and UR22 of the control voltage on one side each of the value UR02 which indicates the nominal amplification Ao. With the circuit according to FIG. 3, instead a nearly linear characteristic is obtained for the values UR12 which are greater than the value UR01 which for this circuit indicates a nominal amplification Ao.

With the circuits according to FIGS. 3 and 4, a memory function can be obtained, i.e., if the control voltage UR momentarily disappears, the amplifier will maintain the same amplification as before the disappearance of the control voltage over a certain time interval, usually about 1–3 minutes. This is achieved by connecting a capacitor C9, alternatively the capacitor C10, to the terminal to which the control voltage is supplied and ground potential. When the control voltage is present, the capacitor C9, alternatively capacitor C10, is charged and when the control voltage is disconnected, the capacitor C9, alternatively the capacitor C10, discharges across the high ohmic resistors R12, R13, R14 according to FIG. 3 and across the resistors R15, R16, R17, R18, R19 according to FIG. 4 together with the back resistance of the capacitance diodes. As the resistance of the capacitance diodes is very high in the reverse direction, a sufficiently high time constant can be obtained, which determines how fast the imposed control voltage decreases after having been disconnected.

We claim:

1. A broad band amplifier having negative feedback and a controllable amplification factor comprising:
    an amplifier stage with constant amplification factor and having an input adapted to receive a signal to be amplified and an output;
    a first impedance converter having a high impedance input and a low impedance output, the input being connected to the output of said amplifier stage for converting the high impedance output from said stage to a low impedance output;
    a capacitive voltage divider including variable capacitor means and having a first input connected to the output of said first impedance converter and an output;
    a second impedance converter having a high impedance input connected to the output of said capacitive voltage divider and a low impedance output; and
    connecting means for connecting the output of said second impedance converter to the input of said amplifier stage for controlling the negative feedback of the amplifier in dependence on the capacitance of the capacitor means in said capacitive voltage divider, whereby the amplification factor of the amplifier can be controlled.

2. An amplifier as claimed in claim 1 wherein said variable capacitor means comprises at least two variable capacitors.

3. An amplifier as claimed in claim 1 wherein said connecting means includes a negative feedback link.

4. An amplifier as claimed in claim 1, wherein said capacitive voltage divider includes a capacitive series link connected to the output of said first impedance converter and a capacitive shunt link connected to the input of said second impedance converter.

5. An amplifier as claimed in claim 4, wherein said capacitive series and shunt link consist of constant but beforehand adjusted capacitors.

6. An amplifier as claimed in claim 4, wherein said capacitive series link includes two voltage dependent capacitors having the same poles connected to a common connection point, said point defining a control input of the amplifier which is adapted to receive a control voltage and wherein said capacitive shunt link includes a capacitor having a voltage independent capacitance.

7. An amplifier as claimed in claim 4, wherein said capacitive series link includes two voltage dependent capacitors having the same poles connected to a first common connection point, said point being connected to a first reference potential, and wherein said capacitive shunt link includes two further voltage dependent capacitors having the same poles connected to a second common connection point, said second point being connected to a second reference potential, a control terminal, means for connecting said control terminal to the pole of one voltage dependent capacitor in said series link which is not connected to said first common connection point, and means for connecting said control terminal to the poles of the capacitors included in said shunt link which are not connected to said second common connection point.

8. An amplifier as claimed in claim 6, wherein said voltage dependent capacitors consist of capacitor diodes, and means for connecting a control voltage to said control input of the amplifier for biasing the capacitor diodes in their reverse direction.

9. An amplifier as claimed in claim 7, wherein said voltage dependent capacitors in said series link and in said shunt link consist of capacitor diodes, and means for connecting a control voltage to said control terminal for biasing the capacitor diodes in their reverse direction.

* * * * *